United States Patent
Hao et al.

(10) Patent No.: US 11,631,356 B2
(45) Date of Patent: Apr. 18, 2023

(54) DISPLAY PANEL AND DISPLAY DEVICE

(71) Applicants: Beijing BOE Technology Development Co., Ltd., Beijing (CN); BOE Technology Group Co., Ltd., Beijing (CN)

(72) Inventors: Xueguang Hao, Beijing (CN); Hongfei Cheng, Beijing (CN); Yongda Ma, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/556,697

(22) Filed: Dec. 20, 2021

(65) Prior Publication Data
US 2022/0230572 A1 Jul. 21, 2022

(30) Foreign Application Priority Data
Jan. 20, 2021 (CN) .......................... 202120148973.5

(51) Int. Cl.
*G09G 3/20* (2006.01)
*H01L 27/12* (2006.01)

(52) U.S. Cl.
CPC ............. *G09G 3/20* (2013.01); *H01L 27/124* (2013.01); *G09G 2300/0408* (2013.01); *G09G 2300/0876* (2013.01)

(58) Field of Classification Search
CPC ......... G09G 3/3266; G09G 2300/0408; G09G 2300/0426; G09G 2300/0876; G09G 2310/0232; G09G 2320/0223; G09G 2320/0233; G09G 3/3674; G09G 3/3677; H01L 27/3276; H01L 27/1225; H01L 27/124; H10K 51/131
See application file for complete search history.

(56) References Cited

U.S. PATENT DOCUMENTS

| | | | |
|---|---|---|---|
| 2008/0129718 A1* | 6/2008 | Nishimura | H03K 17/122 345/87 |
| 2017/0352311 A1* | 12/2017 | Lee | G09G 3/3233 |
| 2018/0342194 A1* | 11/2018 | Li | G09G 3/3677 |
| 2018/0366066 A1* | 12/2018 | Kim | H01L 27/3265 |

* cited by examiner

*Primary Examiner* — Amr A Awad
*Assistant Examiner* — Aaron Midkiff
(74) *Attorney, Agent, or Firm* — IPro, PLLC (57) ABSTRACT

A display panel and a display device are provided, the display panel includes a gate driving circuit, a first pixel module, and a second pixel module, the first pixel module includes a first pixel circuit, and the second pixel module includes a second pixel circuit; the gate driving circuit respectively provides corresponding gate driving signals for the first pixel circuit and the second pixel circuit; in the first display region, the number of columns of the pixel circuit included by the first pixel module is greater than the maximum number of columns of the pixel circuit included by the second pixel module in the second display region; the display panel further includes a loading structure arranged in a non-display region; the load structure is electrically connected to the gate wiring; the gate wiring is wiring between the gate driving circuit and the second pixel circuit for providing the corresponding gate driving signals to the second pixel circuit.

14 Claims, 5 Drawing Sheets

DISPLAY PANEL AND DISPLAY DEVICE

CROSS-REFERENCE TO RELATED APPLICATIONS

This application claims priority to Chinese Patent Application No. 202120148973.5 filed in China on Jan. 20, 2021, which is incorporated herein by reference in its entirety.

TECHNICAL FIELD

The present disclosure relates to the technical field of display, and particularly to a display panel and a display device.

BACKGROUND

More and more display panels use a special-shaped display screen, however, the brightness of a special-shaped region in a special-shaped display screen is always different from that of an active display region, resulting in that the display uniformity of the display panel cannot be guaranteed. How to improve the uniformity of display on a display panel has become a problem to be solved by persons skilled in the art.

SUMMARY

A main object of the present disclosure is to provide a display panel and a display device, which solve the problem in the related art that the brightness of a special-shaped region in a special-shaped display screen is different from the brightness of an active display region, thereby failing to ensure display uniformity.

In order to achieve the above-mentioned object, the present disclosure provides the display panel, which includes a gate driving circuit arranged in a GOA region, a first pixel module arranged in a first display region, and a second pixel module arranged in a second display region; wherein the first pixel module includes a first pixel circuit, and the second pixel module includes a second pixel circuit;

the gate driving circuit is used for respectively providing corresponding gate driving signals for the first pixel circuit and the second pixel circuit;

and in the first display region, the number of columns of the pixel circuit included by the first pixel module is greater than the maximum number of columns of the pixel circuit included by the second pixel module in the second display region;

the display panel further comprises a load structure arranged in a non-display region, wherein the load structure is electrically connected to the gate wiring;

the gate wiring is the wiring between the gate driving circuit and the second pixel circuit for providing the corresponding gate driving signals to the second pixel circuit.

Optionally, the first display region is an active display region.

Optionally, the display panel according to at least one embodiment of the present disclosure further includes a driving integrated circuit, wherein the drive integrated circuit is arranged on a first side edge of the display panel;

the second display region and the loading structure are arranged on a second side edge of the display panel, wherein the second side edge is a side edge opposite the first side edge.

Optionally, on a second side of the display panel, the display panel includes a first region, a second region, and a compensation region arranged between the first region and the second region;

the display panel includes a first second pixel module arranged in a first second display region, a second second pixel module arranged in a second second display region, a first loading structure, a second loading structure, and a third loading structure; the first second pixel module includes a first second pixel circuit, and the second second pixel module includes a second second pixel circuit;

the first second pixel module and the first load structure are arranged in the first region, the second second pixel module and the second load structure are arranged in the second region, and the third load structure is arranged in the compensation region;

the first loading structure and the third loading structure are respectively electrically connected to a first gate wiring, and the second loading structure and the third loading structure are respectively electrically connected to the second gate wiring;

the first gate wiring is the wiring between the gate driving circuit and the first second pixel circuit for providing the corresponding gate driving signals for the first second pixel circuit; and the second gate wiring is wiring between the gate driving circuit and the second second pixel circuit for providing the corresponding gate driving signals to the second second pixel circuit.

Optionally, the loading structure includes a capacitive circuit;

the capacitive circuit includes at least one capacitor; when the number of capacitors included in the capacitor circuit is greater than 1, the capacitors included in the capacitor circuit are connected in parallel with each other.

Optionally, the display panel includes an insulating layer and at least two metal layers on a base substrate;

the insulating layer is arranged between two adjacent metal layers;

a first plate of the capacitor is arranged on one of the metal layers, and a second plate of the capacitor is arranged on the other of the metal layers;

when the number of capacitors included in the capacitor circuit is greater than 1, the first plates of the capacitors included in the capacitor circuit are electrically connected to each other, and the second plates of the capacitors included in the capacitor circuit are electrically connected to each other;

and the first plate of the capacitor is electrically connected to the gate wiring.

Optionally, the display panel includes at least one gate metal layer and at least one source drain metal layer.

Optionally, the load structure includes resistance wiring.

Optionally, the display panel includes an insulating layer and at least two metal layers on a base substrate;

the resistance wiring is arranged on the metal layer; optionally, the resistance wiring includes at least two sub-wiring in series with each other, each of the sub-wiring is arranged on one of the metal layers respectively.

The display device described in embodiments of the present disclosure includes the display panel;

and the display panel includes a gate driving circuit arranged in a GOA region, a first pixel module arranged in a first display region, and a second pixel module arranged in a second display region; the first pixel module includes a first pixel circuit and the second pixel module includes a second pixel circuit;

the gate driving circuit is used for respectively providing the corresponding gate driving signals for the first pixel circuit and the second pixel circuit;

and in the first display region, the number of columns of the pixel circuit included by the first pixel module is greater than the maximum number of columns of the pixel circuit included by the second pixel module in the second display region;

the display panel further includes a load structure arranged in a non-display region, wherein the load structure is electrically connected to the gate wiring;

the gate wiring is the wiring between the gate driving circuit and the second pixel circuit for providing the corresponding gate driving signals to the second pixel circuit.

Optionally, the first display region is an active display region.

Optionally, the display apparatus further comprises a driving integrated circuit, wherein the drive integrated circuit is arranged on a first side edge of the display panel;

the second display region and the loading structure are arranged on a second side edge of the display panel, wherein the second side edge is a side edge opposite the first side edge.

Optionally, on a second side of the display panel, the display panel includes a first region, a second region, and a compensation region arranged between the first region and the second region;

the display panel includes a first second pixel module arranged in a first second display region, a second second pixel module arranged in a second second display region, a first loading structure, a second loading structure, and a third loading structure; the first second pixel module includes a first second pixel circuit, and the second second pixel module includes a second second pixel circuit;

the first second pixel module and the first load structure are arranged in the first region, the second second pixel module and the second load structure are arranged in the second region, and the third load structure is arranged in the compensation region;

the first loading structure and the third loading structure are respectively electrically connected to the first gate wiring, and the second loading structure and the third loading structure are respectively electrically connected to the second gate wiring;

the first gate wiring is the wiring between the gate driving circuit and the first second pixel circuit for providing the corresponding gate driving signals for the first second pixel circuit; and the second gate wiring is the wiring between the gate driving circuit and a second second pixel circuit for providing the corresponding gate drive signals to the second second pixel circuit.

Optionally, the loading structure includes a capacitive circuit;

the capacitive circuit includes at least one capacitor; when the number of capacitors included in the capacitor circuit is greater than 1, the capacitors included in the capacitor circuit are connected in parallel with each other.

Optionally, the display device includes an insulating layer and at least two metal layers on a base substrate;

the insulating layer is arranged between two adjacent metal layers;

a first plate of the capacitor is arranged on one of the metal layers, and a second plate of the capacitor is arranged on the other of the metal layers;

when the number of capacitors included in the capacitor circuit is greater than 1, the first plates of the capacitors included in the capacitor circuit are electrically connected to each other, and the second plates of the capacitors included in the capacitor circuit are electrically connected to each other;

and the first plate of the capacitor is electrically connected to the gate wiring.

Optionally, the display device includes at least one gate metal layer and at least one source drain metal layer.

Optionally, the load structure includes resistance wiring.

Optionally, the display device includes an insulating layer and at least two metal layers on a base substrate;

the resistance wiring is arranged on the metal layer; optionally, the resistance wiring includes at least two sub-wiring in series with each other, each of the sub-wiring is arranged on one of the metal layers respectively.

The display panel and the display device according to the embodiments of the present disclosure adopt the loading structure arranged in the non-display region, and the loading structure is arranged to be electrically connected to the gate wiring between the gate driving circuit and the second pixel circuit for providing the corresponding gate driving signals for the second pixel circuit, so as to increase the loading of the gate driving unit for providing the gate driving signals for the second pixel circuit, and improve the display uniformity of the display panel.

DETAILED DESCRIPTION

In the technical solutions of embodiments of the present disclosure will now be described more fully hereinafter with reference to the accompanying drawings, in which some, but not all embodiments of the disclosure are shown. All other embodiments obtained by those of ordinary skill in the art on the basis of the embodiments in the application without creative work shall fall within the scope of protection of the application.

A display panel according to the embodiments of the present disclosure includes a gate driving circuit arranged in a GOA (Gate On Array) region, a first pixel module arranged in a first display region, and a second pixel module arranged in a second display region, wherein the first pixel module includes a first pixel circuit, and the second pixel module includes a second pixel circuit;

the gate driving circuit is used for respectively providing corresponding gate driving signals for the first pixel circuit and the second pixel circuit;

and in the first display region, the number of columns of the pixel circuit included by the first pixel module is greater than the maximum number of columns of the pixel circuit included by the second pixel module in the second display region;

the display panel further includes a load structure arranged in a non-display region, wherein the load structure is electrically connected to the gate wiring;

the gate wiring is the wiring between the gate driving circuit and the second pixel circuit for providing the corresponding gate driving signals to the second pixel circuit.

A display panel according to the embodiments of the present disclosure includes a first pixel module arranged in a first display region and a second pixel module arranged in a second display region, wherein in the first display region, the number of columns of a pixel circuit included by the first pixel module is greater than the maximum number of columns of a pixel circuit included by the second pixel module in the second display region, and therefore compared with the load of a gate driving circuit provided for the first pixel circuit included by the gate driving circuit, the load of the gate driving unit for providing gate driving signals for the second pixel circuit included by the gate driving circuit is smaller; therefore, there will be a certain difference between the brightness of a first display region and the brightness of a second display region. Based on this, the display panel of the present disclosure adopts the loading structure arranged in the non-display region, and the loading structure is arranged to be electrically connected to the gate wiring between the gate driving circuit and the second pixel circuit for providing the corresponding gate driving signals for the second pixel circuit, so as to increase the loading of the gate driving unit for providing the gate driving signals for the second pixel circuit, and improve the display uniformity of the display panel.

In at least one embodiment of the present disclosure, the display panel can be a shaped display panel, the first display region cab be an active display region, and the second display region can be the shaped display region.

Optionally, the display panel according to the embodiment of the present disclosure further includes a driving integrated circuit, wherein the drive integrated circuit is arranged on a first side edge of the display panel;

the second display region and the loading structure are arranged on a second side edge of the display panel, wherein the second side edge is a side edge opposite the first side edge.

In particular implementation, the display panel can include an Integrated Circuit (IC) attached to the first side edge of the display panel, and the second display region and the loading structure can be arranged on the second side edge of the display panel opposite to the first side edge; and the display panel can also be provided with the third side edge and the fourth side edge opposite to each other, and the GOA region can be provided on the third side edge and the fourth side edge.

In at least one embodiment of the present disclosure, at the second side of the display panel, the display panel can include the first region, the second region, and the compensation region arranged between the first region and the second region;

the display panel includes a first second pixel module arranged in a first second display region, a second second pixel module arranged in a second second display region, a first loading structure, a second loading structure, and a third loading structure; the first second pixel module includes a first second pixel circuit, and the second second pixel module includes a second second pixel circuit;

the first second pixel module and the first load structure are arranged in the first region, the second second pixel module and the second load structure are arranged in the second region, and the third load structure is arranged in the compensation region;

the first loading structure and the third loading structure are respectively electrically connected to a first gate wiring, and the second loading structure and the third loading structure are respectively electrically connected to the second gate wiring;

the first gate wiring is the wiring between the gate driving circuit and the first second pixel circuit for providing the corresponding gate driving signals for the first second pixel circuit; and the second gate wiring is wiring between the gate driving circuit and the second second pixel circuit for providing corresponding gate driving signals to the second second pixel circuit.

Figure 1:
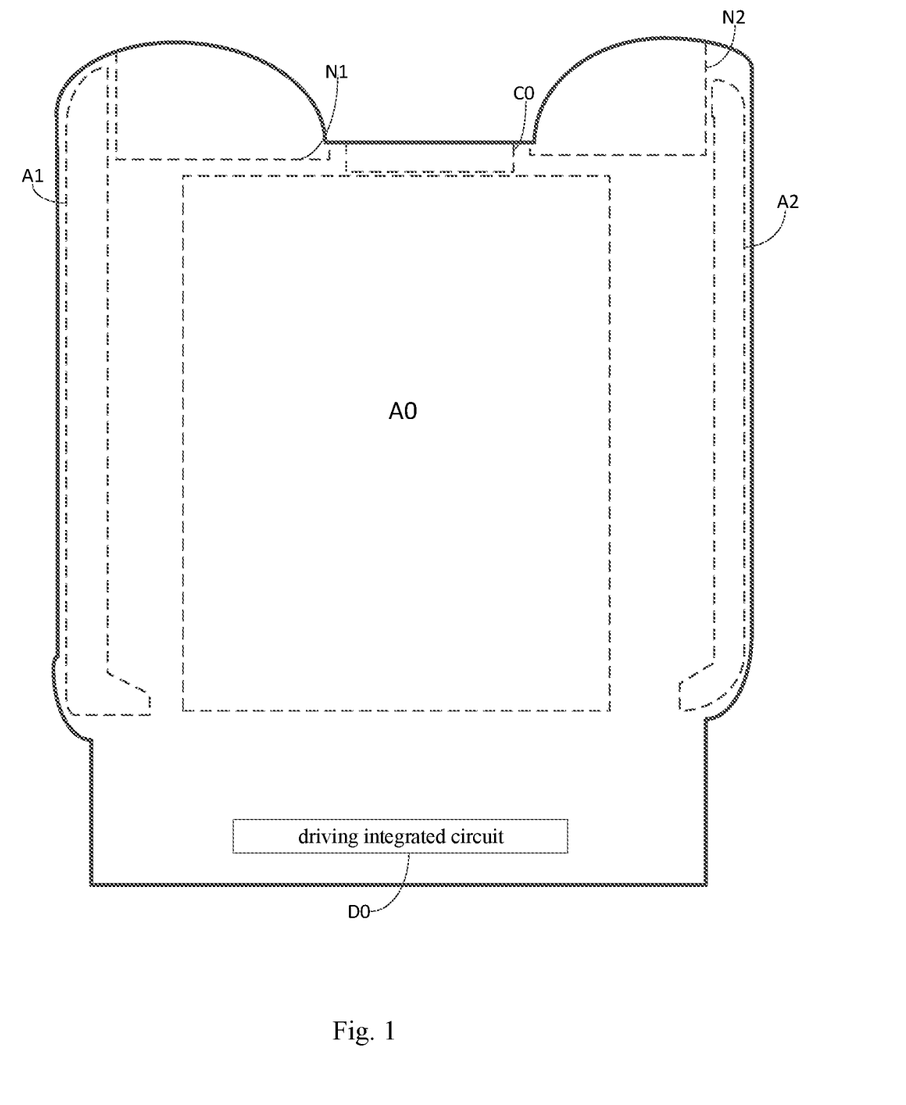
FIG. 1 is a schematic diagram of region division of a display panel according to at least one embodiment of the present disclosure.

As shown in FIG. 1, the display panel according to at least one embodiment of the present disclosure includes an active display region A0, a first GOA region A1, a second GOA region A2, a first region N1, a second region N2, and a compensation region C0;

in FIG. 1, a circuit with the serial number DO is the driving integrated circuit;

and the compensation region C0 is arranged between the first region N1 and the second region N2.

Figure 2:
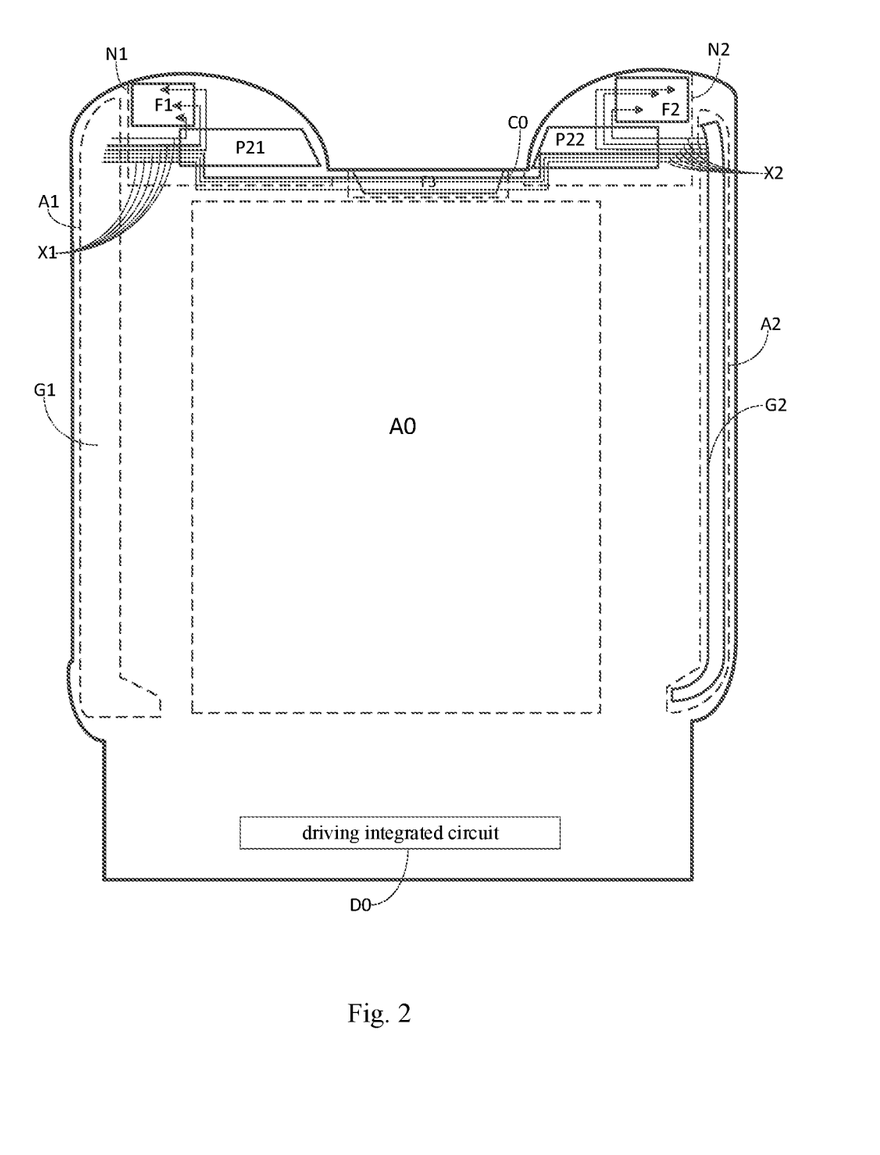
FIG. 2 is a structural diagram of a display panel according to at least one embodiment of the present disclosure.

As shown in FIG. 2, on the basis of the display panel shown in FIG. 1, the display panel includes a first gate driving circuit G1 and a second gate driving circuit G2, wherein the first gate driving circuit G1 is arranged in the first GOA region A1, and the second gate driving circuit G2 is arranged in the second GOA region A2;

the first region N1 includes a first second display region and a first non-display region, and the second region N2 includes a second second display region and a second non-display region;

the display panel includes a first second pixel module P21 and a first loading structure F1 arranged in the first region N1, a second second pixel module P22 and a second loading structure F2 arranged in the second region N2, and a third loading structure F3 arranged in the compensation region C0;

the first pixel module is arranged in the active display region (not shown in FIG. 2);

the first loading structure F1 and the third loading structure F3 are respectively electrically connected to the first gate wiring X1, and the second loading structure F2 and the third loading structure F3 are respectively electrically connected to the second gate wiring X2;

the first gate wiring X1 is the wiring between the first gate driving circuit G1 and the first second pixel circuit included in the first second pixel module P21 for providing the corresponding gate driving signals for the first second pixel circuit;

the second gate wiring X2 is the wiring between the second gate driving circuit G2 and the second second pixel circuit included by the second second pixel module P22 for providing the corresponding gate driving signals for the second second pixel circuit.

As shown in FIG. 2, the first region N1 can be arranged at the upper left of A0, the second region N2 can be arranged at the upper right of A0, and the compensation region C0 is arranged directly above the A0;

In at least one embodiment of the display panel shown in FIG. 2, the first loading structure F1 and the third loading structure F3 are respectively electrically connected to the first gate wiring X1, and the second loading structure F2 and the third loading structure F3 are respectively electrically connected to the second gate wiring X2, so as to increase the loading of the gate driving unit providing the gate driving signals for P21 and increase the loading of a gate driving unit providing a gate driving signals for P22, and improve the display uniformity of the display panel.

In at least one embodiment of the display panel shown in FIG. 2, X1 is the first gate wiring between G1 and P21, and X2 is the second gate wiring between G2 and P22.

Figure 3:
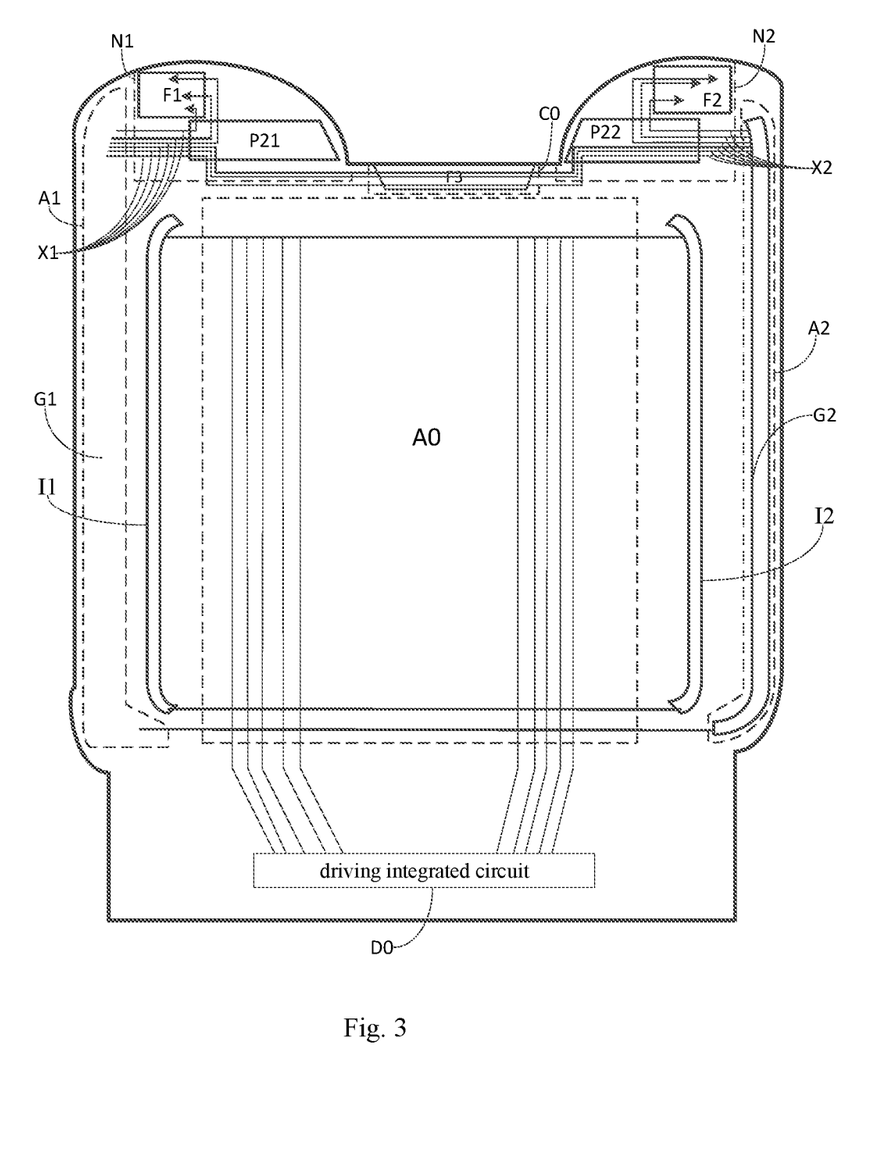
FIG. 3 is a structural diagram of a display panel according to at least one embodiment of the present disclosure.

On the basis of at least one embodiment of the display panel shown in FIG. 2, as shown in FIG. 3, a first initial voltage line I1 can be provided between the active display region A0 and the first GOA region A1, and a second initial voltage line I2 can be provided between the active display region A0 and the second GOA region A2; I1 and I2 are electrically connected through a transverse wire, and the driving integrated circuit DO can be electrically connected to the transverse wire through a plurality of vertical initial voltage signal wires so that DO is electrically connected to I1 and I2, respectively.

In FIGS. 1-3, the first loading structure F1 and the second loading structure F2 can be capacitors, and the orthographic projection of the plates of the capacitors on the base substrate can be rectangular.

Figure 4:
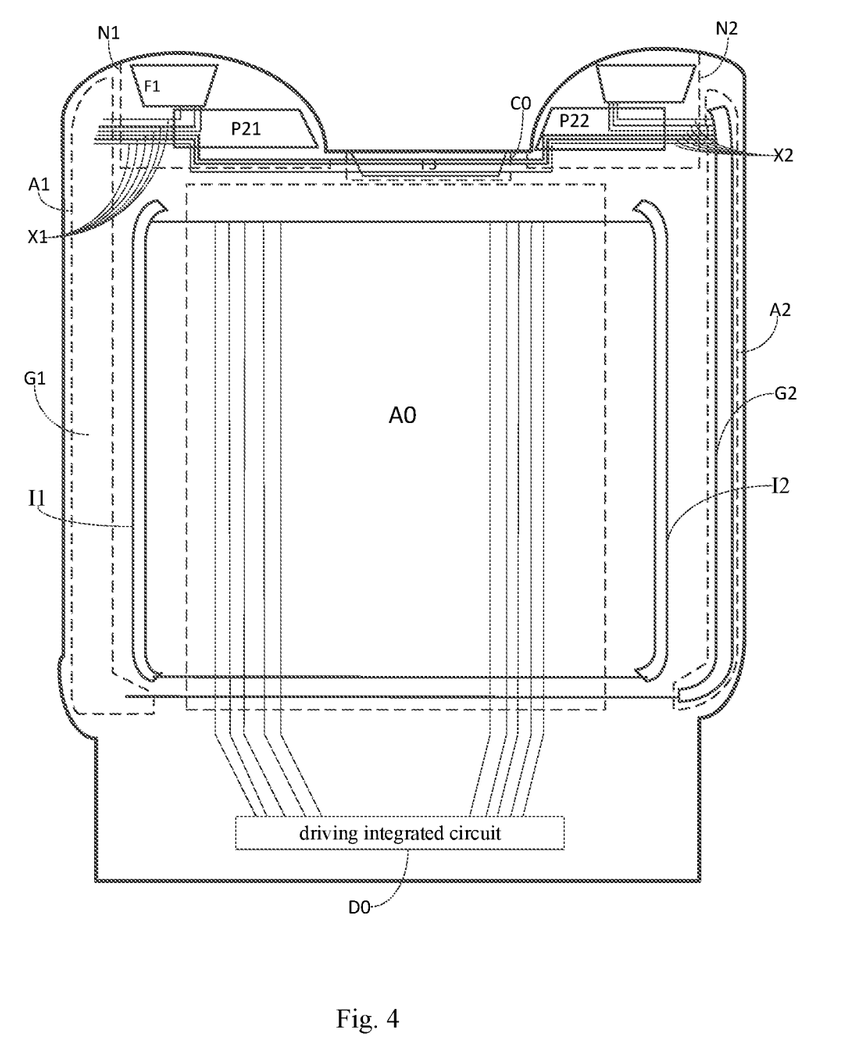
FIG. 4 is a structural diagram of a display panel according to at least one embodiment of the present disclosure.

The at least one embodiment of the display panel shown in FIG. 4 differs from the at least one embodiment of the display panel shown in FIG. 3; the first loading structure F1 and the second loading structure F2 are capacitors, and the positive projection of the plates of the capacitors on the substrate has the shape of a trapezoid. In practice, the shape of the orthographic projection of the plates of the capacitor on the base plate can also be other shapes.

In at least one embodiment of the display panel shown in FIGS. 2-4, the first gate driving circuit provides the gate driving signals to all first second pixel circuits in the first second pixel module, and the second gate driving circuit provides gate driving signals to the second second pixel circuit.

In at least one embodiment of the display panel shown in FIGS. 1-4, the first region can be the first shaped region and the second region can be the second shaped region.

In at least one embodiment of the present disclosure, the loading structure can include, but is not limited to, the capacitive circuit or the resistive wiring.

According to a specific embodiment, the loading structure includes the capacitive circuit;

the capacitive circuit includes at least one capacitor; when the number of capacitors included in the capacitor circuit is greater than 1, the capacitors included in the capacitor circuit are connected in parallel with each other.

Figure 5:
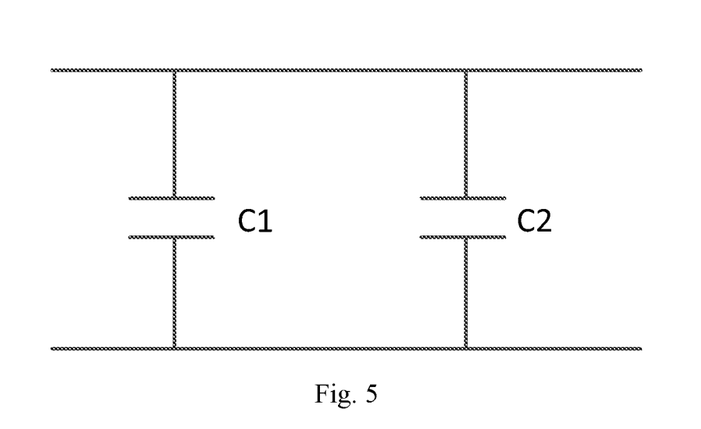
FIG. 5 is a structural diagram of at least one embodiment of a load structure including a capacitive circuit in a display panel according to an embodiment of the present disclosure.

As shown in FIG. 5, when the capacitive circuit includes a first capacitor C1 and a second capacitor C2, C1 and C2 are connected in parallel with each other.

In specific implementations, the display panel can include the insulating layer and at least two metal layers on the base substrate;

the insulating layer is arranged between two adjacent metal layers;

a first plate of the capacitor is arranged on one of the metal layers, and a second plate of the capacitor is arranged on the other of the metal layers;

when the number of capacitors included in the capacitor circuit is greater than 1, the first plates of the capacitors included in the capacitor circuit are electrically connected to each other, and the second plates of the capacitors included in the capacitor circuit are electrically connected to each other;

and the first plate of the capacitor is electrically connected to the gate wiring.

Optionally, the display panel includes at least one gate metal layer and at least one source drain metal layer.

In specific implementation, the display panel can include an active layer, at least one layer of gate metal layer, and at least one layer of a source/drain metal layer which are successively arranged on the base substrate;

For example, when the display panel includes the active layer, the first gate metal layer, the second gate metal layer, the first source/drain metal layer, and the second source/drain metal layer which are successively arranged on the base substrate;

The gate wiring can be arranged on the first gate metal layer or the second gate metal layer, the first plate of the capacitor can be arranged on the first gate metal layer or the second gate metal layer, and the first plate of the capacitor is electrically connected to the gate wiring;

when the first plate of the capacitor is arranged on the first gate metal layer, the second plate of the capacitor can be arranged on the second gate metal layer, the first source/drain metal layer, or the second source/drain metal layer;

when the first plate of the capacitor is arranged on the second gate metal layer, the second plate of the capacitor can be arranged on the first source/drain metal layer or the second source/drain metal layer;

but it is not limited thereto.

According to another embodiment, the loading structure includes the resistance wiring.

In specific implementations, the display panel includes the insulating layer and at least two metal layers on the base substrate;

the resistance wiring is arranged on the metal layer; optionally, the resistance wiring includes at least two sub-wiring in series with each other, each of the sub-wiring is arranged on one of the metal layers respectively.

The display device described in embodiments of the present disclosure includes the display panel;

and the display panel includes a gate driving circuit arranged in a GOA region, a first pixel module arranged in a first display region, and a second pixel module arranged in a second display region; the first pixel module includes a first pixel circuit and the second pixel module includes a second pixel circuit;

the gate driving circuit is used for respectively providing corresponding gate driving signals for the first pixel circuit and the second pixel circuit;

and in the first display region, the number of columns of the pixel circuit included by the first pixel module is greater than the maximum number of columns of the pixel circuit included by the second pixel module in the second display region;

the display panel further includes a load structure arranged in a non-display region, wherein the load structure is electrically connected to the gate wiring;

the gate wiring is the wiring between the gate driving circuit and the second pixel circuit for providing corresponding gate driving signals to the second pixel circuit.

Optionally, the first display region is an active display region.

Optionally, the display apparatus further comprises a driving integrated circuit, wherein the drive integrated circuit is arranged on a first side edge of the display panel;

the second display region and the loading structure are arranged on a second side edge of the display panel, wherein the second side edge is a side edge opposite the first side edge.

Optionally, on a second side of the display panel, the display panel includes a first region, a second region, and a compensation region arranged between the first region and the second region;

the display panel includes a first second pixel module arranged in a first second display region, a second second pixel module arranged in a second second display region, a first loading structure, a second loading structure, and a third loading structure; the first second pixel module includes a first second pixel circuit, and the second second pixel module includes a second second pixel circuit;

the first second pixel module and the first load structure are arranged in the first region, the second second pixel module and the second load structure are arranged in the second region, and the third load structure is arranged in the compensation region;

the first loading structure and the third loading structure are respectively electrically connected to the first gate wiring, and the second loading structure and the third loading structure are respectively electrically connected to the second gate wiring;

the first gate wiring is the wiring between the gate driving circuit and the first second pixel circuit for providing the corresponding gate driving signals for the first second pixel circuit; and the second gate wiring is the wiring between the gate driving circuit and a second second pixel circuit for providing the corresponding gate drive signals to the second second pixel circuit.

Optionally, the loading structure includes a capacitive circuit;

the capacitive circuit includes at least one capacitor; when the number of capacitors included in the capacitor circuit is greater than 1, the capacitors included in the capacitor circuit are connected in parallel with each other.

Optionally, the display device includes an insulating layer and at least two metal layers on a base substrate;

the insulating layer is arranged between two adjacent metal layers;

a first plate of the capacitor is arranged on one of the metal layers, and a second plate of the capacitor is arranged on the other of the metal layers;

when the number of capacitors included in the capacitor circuit is greater than 1, the first plates of the capacitors included in the capacitor circuit are electrically connected to each other, and the second plates of the capacitors included in the capacitor circuit are electrically connected to each other;

and the first plate of the capacitor is electrically connected to the gate wiring.

Optionally, the display device includes at least one gate metal layer and at least one source drain metal layer.

Optionally, the load structure includes resistance wiring.

Optionally, the display device includes an insulating layer and at least two metal layers on a base substrate;

the resistance wiring is arranged on the metal layer; optionally, the resistance wiring includes at least two sub-wiring in series with each other, each of the sub-wiring is arranged on one of the metal layers respectively.

The display device provided by the embodiments of the present disclosure may be any product or component having a display function such as a cell phone, a tablet computer, a television, a display, a notebook computer, a digital photo frame, a navigator, etc.

While the foregoing is directed to alternative embodiments of the present disclosure, it should be understood by those skilled in the art that various improvements and modifications may be made without departing from the principle of the present disclosure, and theses improvement and modifications shall fall within the scope of protection of the present disclosure

What is claimed is:

1. A display panel, comprising a gate driving circuit arranged in a GOA region, a first pixel module arranged in a first display region and a second pixel module arranged in a second display region, wherein the first pixel module comprises a first pixel circuit, and the second pixel module comprises a second pixel circuit;

the gate driving circuit is configured to respectively provide corresponding gate driving signals for the first pixel circuit and the second pixel circuit;

and in the first display region, the number of columns of the pixel circuit comprised by the first pixel module is greater than the maximum number of columns of the pixel circuit comprised by the second pixel module in the second display region;

the display panel further comprises a load structure arranged in a non-display region, wherein the load structure is electrically connected to the gate wiring;

the gate wiring is the wiring between the gate driving circuit and the second pixel circuit for providing corresponding gate driving signals to the second pixel circuit, wherein the display panel further includes a driving integrated circuit, the drive integrated circuit is arranged on a first side edge of the display panel; the second display region and the loading structure are arranged on a second side edge of the display panel, wherein the second side edge is a side edge opposite the first side edge, wherein at the second side edge of the display panel, the display panel comprises a first region, a second region, and a compensation region arranged between the first region and the second region;

the display panel comprises a first second pixel module arranged in a first second display region, a second second pixel module arranged in a second second display region, a first loading structure, a second loading structure, and a third loading structure; the first second pixel module comprises a first second pixel circuit, and the second second pixel module comprises a second second pixel circuit;

the first second pixel module and the first load structure are arranged in the first region, the second second pixel module and the second load structure are arranged in the second region, and the third load structure is arranged in the compensation region;

the first loading structure and the third loading structure are respectively electrically connected to the first gate wiring, and the second loading structure and the third loading structure are respectively electrically connected to the second gate wiring;

the first gate wiring is the wiring between the gate driving circuit and the first second pixel circuit for providing the corresponding gate driving signals for the first second pixel circuit; and the second gate wiring is the wiring between the gate driving circuit and a second second pixel circuit for providing the corresponding gate drive signals to the second second pixel circuit.

2. The display panel according to claim 1, wherein the first display region is an active display region.

3. The display panel according to claim 1, wherein the loading structure comprises a capacitive circuit,
the capacitive circuit comprises at least one capacitor;
when the number of capacitors comprised in the capacitor circuit is greater than 1, the capacitors comprised in the capacitor circuit are connected in parallel with each other.

4. The display panel according to claim 3, comprising an insulating layer and at least two metal layers on a base substrate;
the insulating layer is arranged between two adjacent metal layers;
a first plate of the capacitor is arranged on one of the metal layers, and a second plate of the capacitor is arranged on the other of the metal layers;
when the number of capacitors comprised in the capacitor circuit is greater than 1, the first plates of the capacitors comprised in the capacitor circuit are electrically connected to each other, and the second plates of the capacitors comprised in the capacitor circuit are electrically connected to each other;
and the first plate of the capacitor is electrically connected to the gate wiring.

5. The display panel according to claim 4, comprising at least one gate metal layer and at least one source drain metal layer.

6. The display panel according to claim 1, wherein the loading structure comprises resistance wiring.

7. The display panel according to claim 6, comprising an insulating layer and at least two metal layers on the base substrate;
the resistance wiring is arranged on the metal layer;
optionally, the resistance wiring comprises at least two sub-wirings in series with each other, each of the sub-wirings is arranged on one of the metal layers respectively.

8. A display device, comprising a display panel, wherein the display panel comprises a gate driving circuit arranged in a GOA region, a first pixel module arranged in a first display region, and a second pixel module arranged in a second display region; the first pixel module comprises a first pixel circuit and the second pixel module comprises a second pixel circuit;
the gate driving circuit is configured to respectively provide corresponding gate driving signals for the first pixel circuit and the second pixel circuit;
and in the first display region, the number of columns of the pixel circuit comprised by the first pixel module is greater than the maximum number of columns of the pixel circuit comprised by the second pixel module in the second display region;
the display panel further comprises a load structure arranged in a non-display region, wherein
the load structure is electrically connected to the gate wiring;
the gate wiring is the wiring between the gate driving circuit and the second pixel circuit for providing corresponding gate driving signals to the second pixel circuit,
wherein the display device further includes a driving integrated circuit, wherein the drive integrated circuit is arranged on a first side edge of the display panel; the second display region and the loading structure are arranged on a second side edge of the display panel, wherein the second side edge is a side edge opposite the first side edge,
wherein, at the second side edge of the display panel, the display panel comprises a first region, a second region, and a compensation region provided between the first region and the second region;
the display panel comprises a first second pixel module arranged in a first second display region, a second second pixel module arranged in a second second display region, a first loading structure, a second loading structure, and a third loading structure; the first second pixel module comprises a first second pixel circuit, and the second second pixel module comprises a second second pixel circuit;
the first second pixel module and the first load structure are arranged in the first region, the second second pixel module and the second load structure are arranged in the second region, and the third load structure is arranged in the compensation region;
the first loading structure and the third loading structure are respectively electrically connected to the first gate wiring, and the second loading structure and the third loading structure are respectively electrically connected to the second gate wiring;
the first gate wiring is the wiring between the gate driving circuit and the first second pixel circuit for providing the corresponding gate driving signals for the first second pixel circuit; and
the second gate wiring is the wiring between the gate driving circuit and a second second pixel circuit for providing the corresponding gate drive signals to the second second pixel circuit.

9. The display device according to claim 8, wherein the first display region is an active display region.

10. The display device according to claim 8, wherein the loading structure comprises a capacitive circuit, wherein
the capacitive circuit comprises at least one capacitor;
when the number of capacitors comprised in the capacitor circuit is greater than 1, the capacitors comprised in the capacitor circuit are connected in parallel with each other.

11. The display device according to claim 10, comprising an insulating layer and at least two metal layers on a base substrate, wherein
the insulating layer is arranged between two adjacent metal layers;
a first plate of the capacitor is arranged on one of the metal layers, and a second plate of the capacitor is arranged on the other of the metal layers;
when the number of capacitors comprised in the capacitor circuit is greater than 1, the first plates of the capacitors comprised in the capacitor circuit are electrically connected to each other, and the second plates of the capacitors comprised in the capacitor circuit are electrically connected to each other;
and the first plate of the capacitor is electrically connected to the gate wiring.

12. The display device according to claim 11, comprising at least one gate metal layer and at least one source drain metal layer.

13. The display device according to claim 8, wherein the loading structure comprises resistance wiring.

14. The display device according to claim 13, comprising an insulating layer and at least two metal layers on a base substrate, wherein the resistance wiring is arranged on the metal layer;
optionally, the resistance wiring comprises at least two sub-wirings in series with each other, and each of the sub-wirings is arranged on one of the metal layers respectively.

\* \* \* \* \*